(12) United States Patent
Chang

(10) Patent No.: US 6,903,634 B2
(45) Date of Patent: Jun. 7, 2005

(54) METHOD OF DETUNING RESONANT FREQUENCIES OF A POWER DISTRIBUTION SYSTEM

(75) Inventor: Tsun-hsu Chang, Hsinchu (TW)

(73) Assignee: Silicon Integrated Systems Corp., Hsinchu (TW)

(*) Notice: Subject to any disclaimer, the term of this patent is extended or adjusted under 35 U.S.C. 154(b) by 241 days.

(21) Appl. No.: 10/291,530

(22) Filed: Nov. 12, 2002

(65) Prior Publication Data

US 2004/0090289 A1 May 13, 2004

(51) Int. Cl.[7] .................................................. H01P 7/00
(52) U.S. Cl. ........................ 333/235; 333/236; 333/248
(58) Field of Search ................................. 333/235, 236, 333/248, 33–35; 331/96, 107 SL

(56) References Cited

U.S. PATENT DOCUMENTS 5,926,377 A * 7/1999 Nakao et al. ................ 361/763
6,424,241 B2 * 7/2002 Mordkovich ................ 333/235
6,556,109 B2 * 4/2003 Kanba et al. ................ 333/204

* cited by examiner

Primary Examiner—Robert Pascal
Assistant Examiner—Kimberly E. Glenn
(74) Attorney, Agent, or Firm—Law Offices of David Pai; Chao-Chang David Pai

(57) ABSTRACT

An approach to enhance the noise immunity of high-speed digital signals by means of a resonance-free environment is developed. Resonance detuning is achieved by appropriately reshaping the layout of the power/ground planes. Resonant properties of the power distribution system, including resonant frequencies and field distribution profiles, were characterized with frequency-domain simulations. Analysis of the resonant field profiles reveals that the electric field distribution of the dominant mode normally concentrates in the vicinity of the plane edge. Therefore, resonance can be effectively tuned out of the operating frequency range through boundary configuring. In addition, it is shown that variation of the quality factor with the external probe position provides a means to monitor and construct the resonant field distribution. Physical mechanism responsible for this unique property is clarified from the perspective of probe coupling. A Y-shaped layout is reshaped to effectively realize a resonance-free operating environment.

12 Claims, 9 Drawing Sheets

METHOD OF DETUNING RESONANT FREQUENCIES OF A POWER DISTRIBUTION SYSTEM

BACKGROUND OF THE INVENTION

1. Field of the Invention

The present invention generally relates to a power distribution system and, more particularly, to a method of detuning resonant frequencies of a power distribution system by reshaping layouts of power/ground planes.

2. Description of the Related Art

The growing request for faster data throughput demands higher operating frequency, which constrains the maximum tolerable timing skew caused by noise. Besides, to reduce the electromagnetic interference (EMI) and the power consumption especially in a heavily dense layout, a lower voltage signaling is preferable. Both requirements motivate the study of power quality, aimed at providing better quality of the supply voltage and reducing possible noise sources when signaling. However, the power delivery quality is relatively unexplored for it normally involves a much more complicated system, called power distribution system (PDS).

A PDS of a multi-layer Printed Circuit Board (PCB) normally comprises power and ground planes as well as interconnecting vias, thus basically it is inductive. Consequently, the impedance of the power delivery system increases with the operating frequency. A high-speed, low-voltage signaling system demands low target impedance which relates to the supply voltage quality, especially at a high frequency regime. A common solution is adding sufficient number of vias, which will reduce the inductance of the system.

Another important problem of the PDS is an effect regarding to resonance. As mentioned above, the PDS consists of several conducting planes capable of storing energy forming resonators. If designed improperly, the operating frequency or its harmonics (e.g. 533 MHz and its third harmonics 1600 MHz) was located at or close to the resonant frequencies, then the supply voltage might vary with time imposing extra noise on the signal. Even a signal passing through the plane layers without physical contact, for example a signal via from top layer to the bottom layer, will couple some noise from the resonator. Besides, this resonance effect will deteriorate especially simultaneous switching noise (SSN/SSO) coupled from the signal via or return path, and will worsen the EMI problem since more energy is stored in the resonator. In any circumstance, the effect of resonance might result in not only Power Integrity (PI) but also serious Signal Integrity (SI) problems. Therefore, there is a pressing need to introduce an analysis for the resonant effect in the design phase.

Several remedies have been proposed. The most common solution is adding decoupling/bypass capacitors at a proper position that the capacitors provide an equivalent short loop for the high frequency noise. However, the application of the decoupling capacitor is limited by the equivalent series inductance (ESL) of the lead, where the capacitor becomes inductive at high frequency regime. Moreover, in some congested substrate layout, there is no sufficient space to allocate these extra capacitors.

Another remedy is to reduce a quality factor of the resonant system. This can be done by two ways. The first one is increasing loss by employing a lossy dielectric material. However, the most common dielectric material is epoxy-resin-fiber glass (FR4) possessed a loss tangent of 0.02 at 1 GHz, which is still insufficient to provide enough loss. Therefore, a new material must be developed. The other method is adding some lossy material at circuit board edges, called resistive termination. This method can effectively minimize the reflection and radiation from the edge discontinuity especially at a high frequency regime, but it fails to provide a broadband absorption due to a lack of an appropriate absorbing material.

SUMMARY OF THE INVENTION

In view of the above-mentioned problems, an object of the present invention is to provide a method of detuning the fundamental power/ground plane resonant frequency from the operation frequency of the PDS as well as its harmonics.

Another object of the present invention is to provide a method of reconstructing a resonant field pattern by external probing, thereby facilitating determination of an optimal trimming position.

The inventor analyzes the resonant effect of a two-copper-layer PCB from a frequency-domain viewpoint by using commercial simulation software and electrical measurements. Knowledge of circular and rectangular microstrip resonators provides a foundation for more complicated layouts. Finally, the present invention is applied to a more realistic layout to demonstrate an achievement of significant frequency detuning.

According to an aspect of the present invention, a method of detuning resonant frequencies includes: a) determining a distribution of an intensity of an electric field of a resonant mode of a power/ground plane, b) determining at least one region of the power/ground plane based on the distribution of the intensity of the electric field obtained from the step a) such that a relatively high intensity among the distribution of the electric field is located on the at least one region, and c) reshaping the at least one region.

The distribution of the intensity of the electric field of the resonant mode of the power/ground plane is determined by a) measuring a reflection coefficient $S_{11}$ in a frequency domain for a position of the power/ground plane; b) calculated an intensity of the electric field $f$ according to an equation: $f \propto \sqrt{1-S_{11}^2}$; and c) repeating the steps a) and b) throughout the power/ground plane to construct the distribution of the intensity of the electric field.

The method according to present invention is useful in reducing the power/ground noise in the PDS and should be incorporated into circuit design consideration. Although only a few geometries were demonstrated in the specification, the present invention is applicable to much more complicated power/ground layouts.

BRIEF DESCRIPTION OF THE DRAWINGS

The above-mentioned and other objects, features, and advantages of the present invention will become apparent with reference to the following descriptions and accompanying drawings, wherein:

FIG. 3A is a graph showing a reflection coefficient $S_{11}$, versus a sweeping frequency measured at different positions of a circular microstrip resonator while

FIG. 4A is a graph showing a relative intensity of the electric field of the fundamental mode of a circular microstrip resonator while

FIG. 6A is a schematic diagram showing a method of reshaping a circular microstrip resonator according to the present invention while

FIG. 7A is a schematic diagram showing a method of reshaping a rectangular microstrip resonator according to the present invention while

DETAILED DESCRIPTION OF THE PREFERRED EMBODIMENTS

Figure 1A:
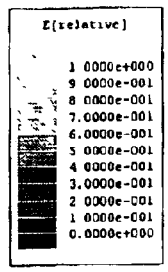
FIGS. 1A to 1D are diagrams showing electric field distribution profiles of the first four resonant modes of a circular microstrip resonator.
Figure 1A:
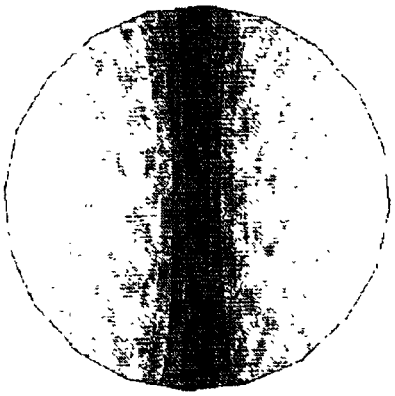
Figure 1B:
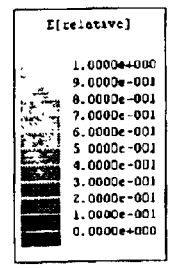
Figure 1B:
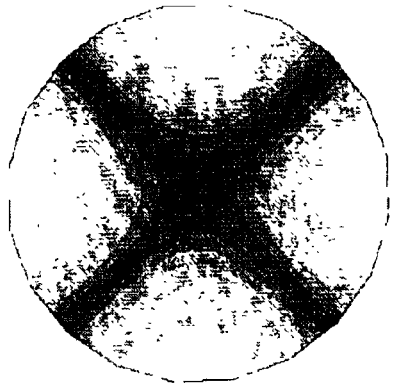
Figure 1C:
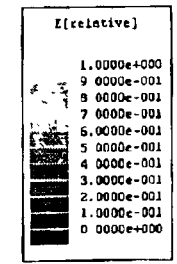
Figure 1C:
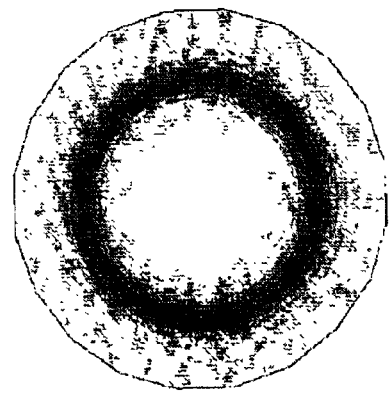
Figure 1D:
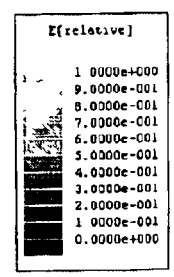
Figure 1D:
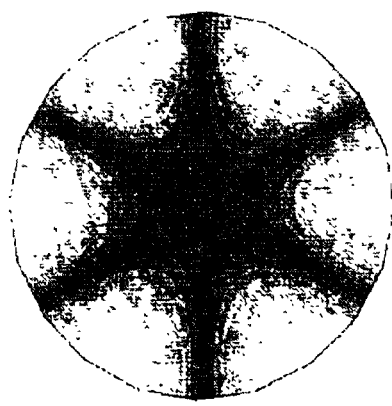

The preferred embodiments according to the present invention will be described in detail with reference to the drawings.

A thickness of a dielectric layer in a multi-layer PCB is normally very small compared with a dimension of power/ground planes. For such a high aspect ratio (ranging from tens to few hundreds), the power/ground plane is assumed to have an electric field distribution with a constant component along the normal direction of the power/ground plane and a variable component, determined by boundary conditions of the power/ground plane, orthogonal to the normal direction (i.e., TM mode).

The power/ground plane shapes are generally modifiable in the multi-layers PCB application. Therefore, it will be beneficial to extract a common property among various layouts. In order to easily appreciate the present invention and effects thereof, two of the simplest planar microstrip resonators, i.e., a circular microstrip resonator and a rectangular microstrip resonator, will be investigated and described in advance, respectively, for conceptual demonstrations.

FIGS. 1A to 1D are diagrams showing electric field distribution profiles of the first four resonant modes of a circular microstrip resonator. More specifically, FIGS. 1A to 1D show the electric field distribution profiles of the four modes $TM_{110}$, $TM_{210}$, $TM_{010}$, and $TM_{310}$, respectively, all of which are located at the middle plane of the circular microstrip resonator. The electric field distribution profiles shown in FIGS. 1A to 1D are obtained from either analytical solutions of mathematical equations according to an electromagnetic theory or numerical simulations using commercial available software. An approximate analysis of this resonator can be readily carried out by treating the outer boundary (the radius is 20 mm in this case) as a perfect open-circuit boundary (magnetic wall). The electric field in the resonator will not depend on the z coordinate for its planar geometry and the only component of the electric field is the axial field component Ez.

Since the electric field component along the z-direction is constant, looking at the middle plane of the resonator will not lose generality. The field patterns looks like their counter part of a TE mode in the circular waveguide. But it should be noted that, unlike their counter part of TE mode in the circular waveguide, the electric field (Ez) has its maximum close to the edge of the circular disk due to open boundary condition. Another important fact is that degenerate modes coexist in the same structure sharing the same field pattern but different polarization. For example, the mode $TM_{110}$ shown in FIG. 1A has two degenerate modes, each of which is different from the other by an azimuthal angle of 90 degrees, and $TM_{210}$ shown in FIG. 1B also has two degenerate modes separated by an azimuthal angle of 45 degrees. For the clarity of demonstration, only relevant polarization modes are shown.

FIGS. 2A to 2D are diagrams showing electric field distribution profiles of the first four resonant modes of a rectangular microstrip resonator with a length-to-width aspect ratio of 2. More specifically, FIGS. 2A to 2D show the four modes $TM_{100}$, $TM_{010}$, $TM_{200}$, and $TM_{110}$, respectively, all of which are calculated at the middle plane of the rectangular microstrip resonator. The electric field distribution profiles shown in FIGS. 2A to 2D are obtained from either analytical solutions of mathematical equations according to the electromagnetic theory or numerical simulations using commercial available software. Like the circular microstrip resonator, the maximum field intensity is located approximately at the edge/corner of the resonator.

It should be noted that the electric field profiles shown in FIGS. 1A to 1D and FIGS. 2A to 2D are obtained from some kind of mathematical methods without any electrical measurements. According to the present invention, a method of reconstructing the electric field profiles through performing electrical measurements by external probing is provided.

A quality factor is a unique property associated with the resonant system. While the quality factor of the resonant system is being measured, however, it is inevitable that the original system is disturbed. A common approach of measuring the quality factor is to probe it with minimum coupling. But in our present application, it will be more efficient and cost effective to use a probe connecting to the power pin and nearest ground pin with careful calibration to the probe tip. In this way, the probe and the resonator are strongly coupled. The coupling effect will, on the one hand, slightly offset the resonant frequency and cause the quality factor to become position dependent, but, on the other hand, it also provides us a measure to probe the electric field distribution. The variation of the coupling amount provides us a means to inspect the resonant field intensity distribution from a perspective of measurement.

Figure 3A:
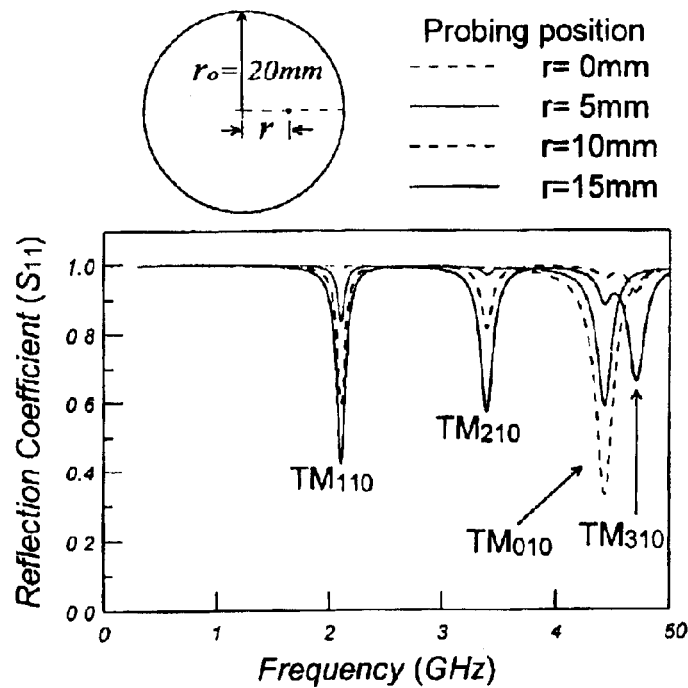
Figure 3B:
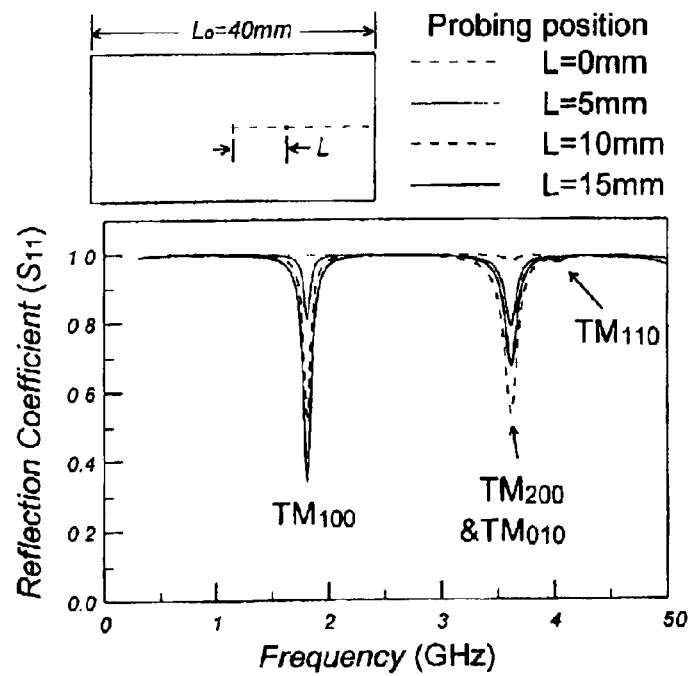
FIG. 3B is a graph showing a reflection coefficient $S_{11}$ versus a sweeping frequency at different positions of the rectangular microstrip resonator.

FIG. 3A is a graph showing a reflection coefficient $S_{11}$ versus a sweeping frequency measured at different positions of a circular microstrip resonator while FIG. 3B is a graph showing a reflection coefficient $S_{11}$ versus a sweeping frequency at different positions of the rectangular microstrip resonator. As mentioned above, the response of the curve is position dependent for both of the circular and rectangular resonators. The higher the coupling, the more energy will be injected into the resonator and the reflection will become very small. This means if the resonator is probed at its field maximum, then the minimum reflection is obtained. On the contrary, if the resonator is probed at the field minimum, the measuring signal cannot be coupled into the resonator, thereby resulting in high reflection or even total reflection. Based on the following equation, $$f(x, y) \propto \sqrt{1-S_{11}^2(x,y)}$$

where $f$ is the electric field intensity and $S_{11}$ is the reflection coefficient, both of which are functions of the probed position (x, y), a distribution of the relative intensity of the electric field can be determined.

Figure 2A:
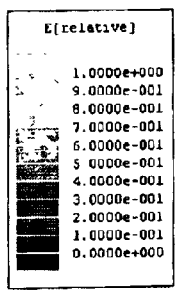
FIGS. 2A to 2D are diagrams showing electric field distribution profiles of the first four resonant modes of a rectangular microstrip resonator.
Figure 2A:
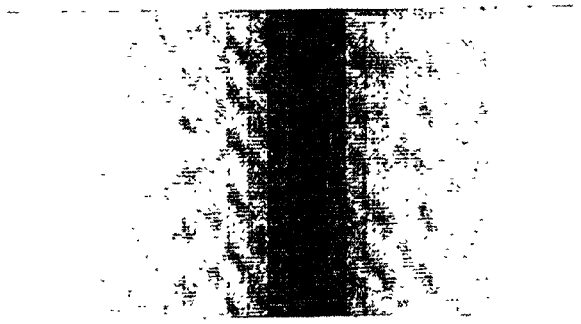
Figure 4A:
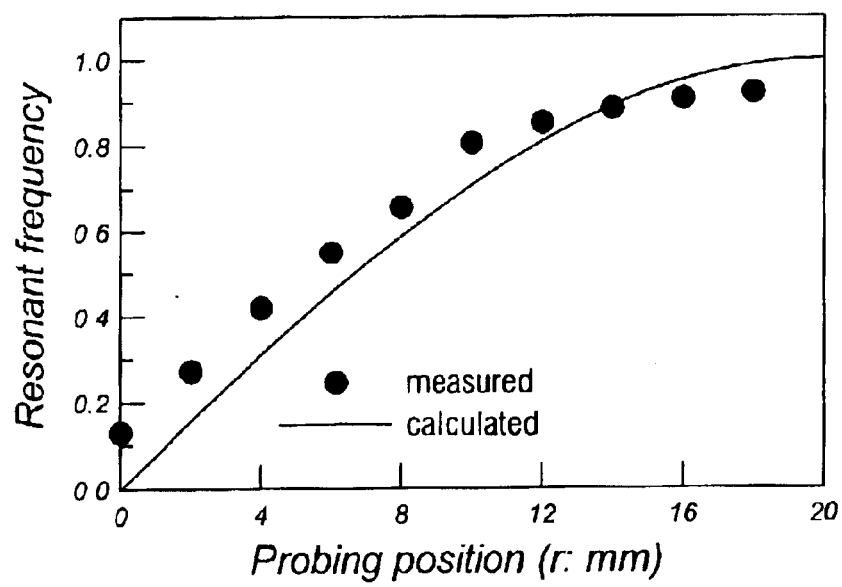
Figure 4B:
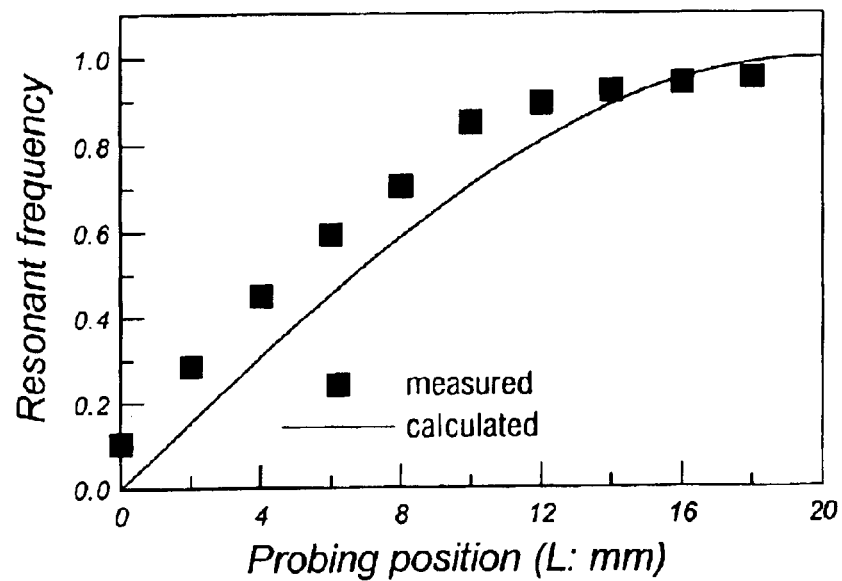
FIG. 4B is a graph showing the relative electric field intensity of the fundamental mode of a rectangular microstrip resonator.

FIG. 4A is a graph showing a relative intensity of the electric field of the fundamental mode of a circular microstrip resonator while FIG. 4B is a graph showing the relative electric field intensity of the fundamental mode of a rectangular microstrip resonator. As shown in FIGS. 4A and 4B, the solid curves are representative of the numerically calculated results as shown in FIGS. 1A and 2A while the dotted curves are representative of the electrically measured and reconstructed results through probing the resonators at various positions according to the present invention.

Figure 5:
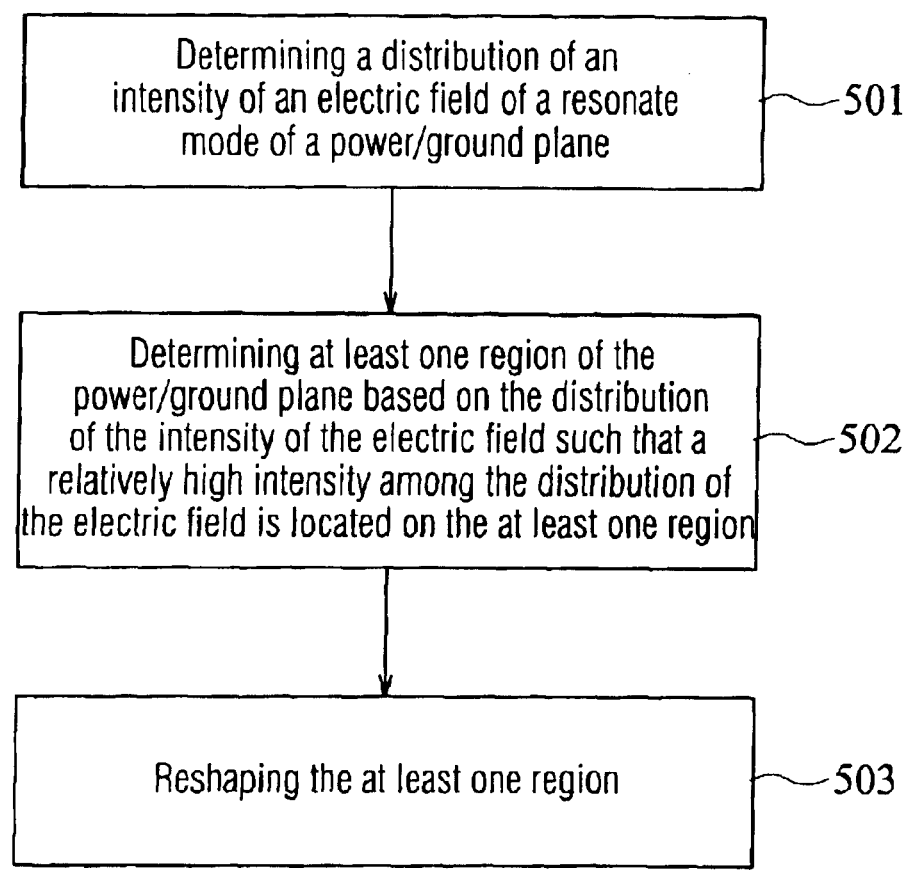
FIG. 5 is a flow chart showing a method of detuning resonant frequencies of a PDS according to the present invention.

FIG. 5 is a flow chart showing a method of detuning resonant frequencies of a PDS according to the present invention. Referring to FIG. 5, the method of detuning resonant frequencies according to the present invention includes: determining a distribution of an intensity of an electric field of a resonant mode of a power/ground plane (step 501), determining at least one region of the power/ground plane based on the distribution of the intensity of the electric field obtained from the step 501 such that a relatively high intensity among the distribution of the electric field is located on the at least one region (step 502), and reshaping the at least one region (step 503). With reference to FIGS. 6 to 11, the method of detuning resonant frequencies according to the present invention is applied to a circular, a rectangular, and a Y-shaped microstrip resonator, respectively.

As mentioned above in conjunction with FIGS. 1A to 1D and 2A to 2D, the electric field patterns of the circular and rectangular microstrip resonators have the field maximum which is basically located at the edge owing to the specific boundary condition. For this reason, it is suggested that reshaping the region associated with the field maximum will alter the resonant frequency.

Figure 6A:
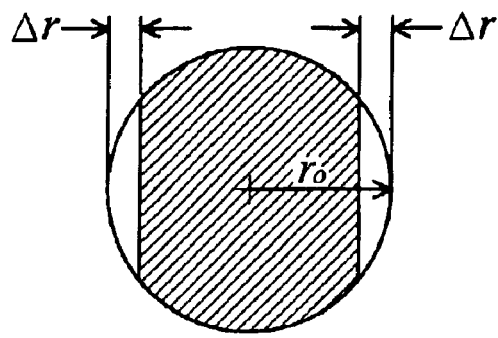
Figure 6B:
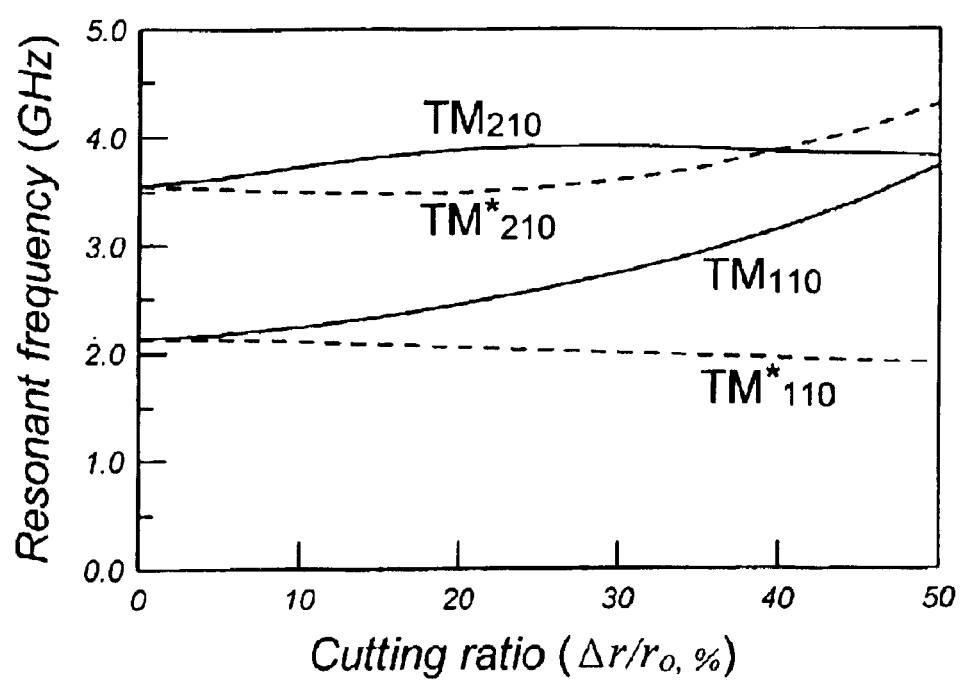
FIG. 6B is a graph showing an effect of the reshaping of the circular microstrip resonator on resonant frequencies.

FIG. 6A is a schematic diagram showing a method of reshaping a circular microstrip resonator according to the present invention while FIG. 6B is a graph showing an effect of the reshaping of the circular microstrip resonator on resonant frequencies. The first two axial modes (solid lines representative of the modes $TM_{110}$ and $TM_{210}$) together with their degenerate modes (dashed lines representative of the modes $TM^*_{110}$ and $TM^*_{210}$) are shown in FIG. 6B. Since the relatively high intensity among the mode $TM_{110}$ locates at the reshaped regions $\Delta r$ as shown in FIG. 1A, reshaping the circular microstrip resonator according to the present invention effectively modifies the boundary condition for the distribution of the electric field, thereby resulting in a significant variation of the resonant frequency. As shown in FIG. 6B, the resonant frequency of the mode $TM_{110}$ is increased approximately by 10% under a condition that the cutting ratio $\Delta r/r_0$ is 10%. Incidentally, it is interesting to note that the degenerate mode $TM^*_{110}$ is inherently unmodified by the reshaping method of FIG. 6A because its relatively high intensity is concentrated at the opposite polarization and thus is rarely influenced. As clearly seen from FIG. 6B, the fundamental mode $TM_{110}$ has the greatest variation of the resonant frequency when applied with the reshaping method of FIG. 6A. Since the mode $TM_{110}$ has the lowest resonant frequency and generally is the biggest potential hazardous to the power quality, raising the resonant frequency of the mode $TM_{110}$ is the most beneficial to the system.

Figure 2B:
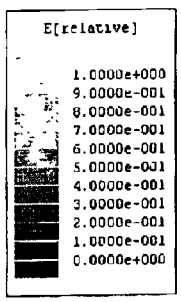
Figure 2B:
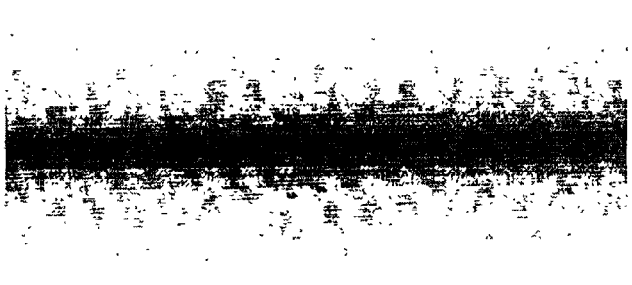
Figure 2C:
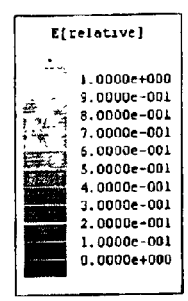
Figure 2C:
Figure 2D:
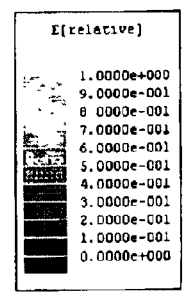
Figure 2D:
Figure 7A:
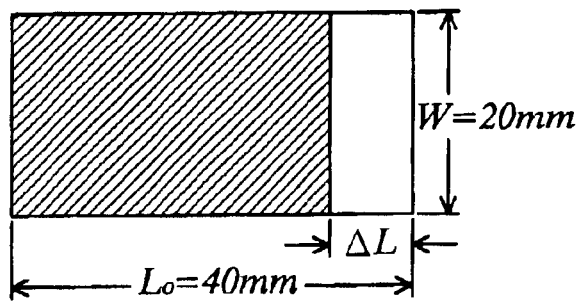
Figure 7B:
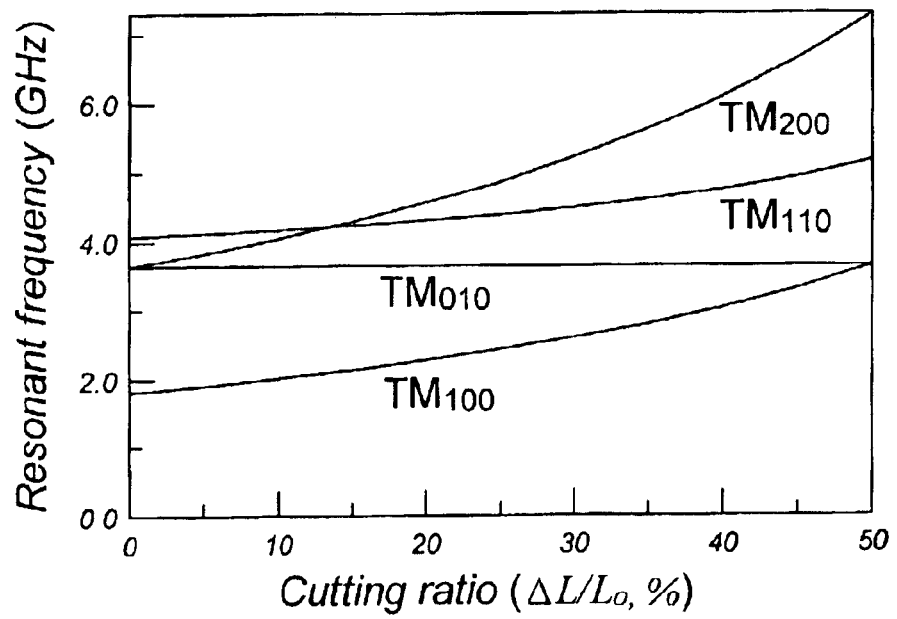
FIG. 7B is a graph showing an effect of the reshaping of the rectangular microstrip resonator on resonant frequencies.

FIG. 7A is a schematic diagram showing a method of reshaping a rectangular microstrip resonator according to the present invention while FIG. 7B is a graph showing an effect of the reshaping of the rectangular microstrip resonator on resonant frequencies. Since the relatively high intensity of the mode $TM_{100}$ locates at the reshaped regions $\Delta L$ as shown in FIG. 2A, reshaping the rectangular microstrip resonator according to the present invention effectively modifies the boundary condition for the distribution of the electric field, thereby resulting in a significant variation of the resonant frequency. As shown in FIG. 7B, the resonant frequency of the fundamental mode $TM_{100}$ is inversely proportional to the length L of the rectangular microstrip resonant. On the contrary, the width W of this rectangular microstrip resonator plays no role on the resonant frequency for the fundamental mode $TM_{110}$. With respect to the mode $TM_{010}$, the resonant frequency thereof remains constant regardless of the cutting ratio $\Delta L/L_0$ since the electric field distribution only depends on the width W direction as shown in FIG. 2B. Unlike the case of the circular microstrip resonator, there is no degenerate mode for the fundamental $TM_{100}$ mode in this layout. Luckily, in the practical motherboard or substrate design, the power/ground planes are more like rectangular shape. Thus, the reshaping method according to the present invention is readily to achieve a resonant free operating environment and further minimize the noise.

Figure 8:
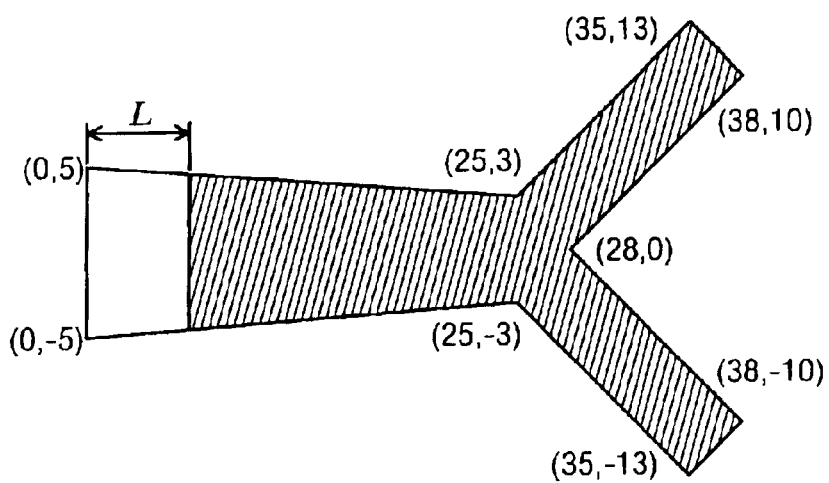
FIG. 8 is a plan view showing a Y-shaped microstrip resonator.

In a multi-layer PCB application, the shape of the power/ground planes is normally a much more complicated polygon, rather than simple geometry, but the reshaping method according to the present invention is applicable to detune the resonant frequencies of any kind of power/ground planes. FIG. 8 is a plan view showing a Y-shaped microstrip resonator, which is usually used as part of the power/ground plane in the multi-layer PCB application. In FIG. 8, the dimension of the Y-shaped microstrip resonator is indicated by means of a two-coordinate system with a unit of mm.

Figure 9A:
FIGS. 9A and 9B are diagrams showing electric field distribution profiles of the first two resonant modes of the Y-shaped microstrip resonator of FIG. 8.
Figure 9B:
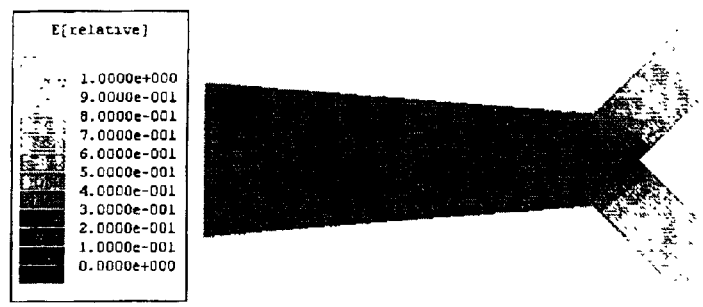

By using a numerical simulation through commercial available software, the electric field patterns of the first two resonant modes of the Y-shaped microstrip resonator are shown in FIGS. 9A and 9B. Referring to FIG. 9A, the fundamental mode with the lowest resonant frequency of 1.632 GHz has a field maximum at a central stem also (called power corridor) and an in-phase field variation at two wings. Referring to FIG. 9B, however, the first high order mode with a resonant frequency of 2.347 GHz has a completely out-of-phase field variation at the two wings, thereby resulting in field cancellation at the central stem. These unique field patterns are further explored in the next two figures.

Figure 10:
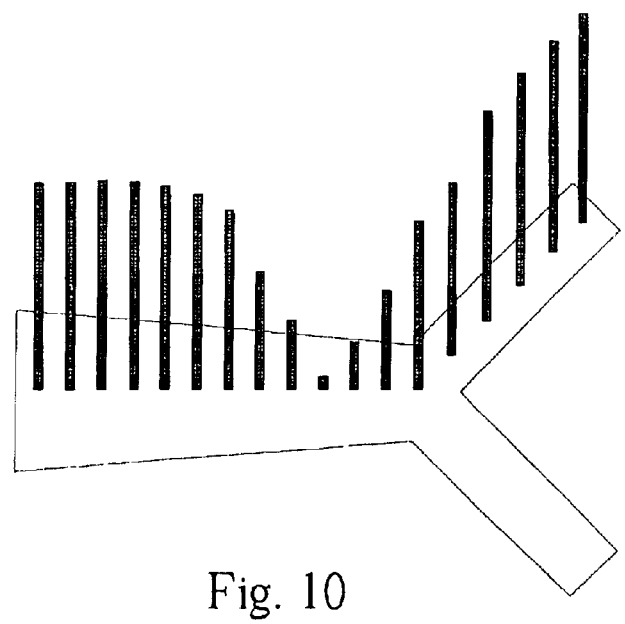
FIG. 10 is a diagram showing a reconstructed electric field intensity of the fundamental mode of the Y-shaped microstrip resonator of FIG. 8 by probing at several different positions along the central line.

FIG. 10 is a diagram showing a reconstructed electric field intensity of the fundamental mode of the Y-shaped microstrip resonator of FIG. 8 by probing at several different positions along the central line. Comparing this figure with the numerically simulated field pattern of FIG. 9A, a pretty good agreement has been achieved. Since the field variations at both wings are identical for the fundamental mode, only the field intensity of one wing is shown in FIG. 10. When probing a resonant system, it is unavoidable to interfere it. Therefore, the measured field pattern of FIG. 10 is slightly different from the simulated field pattern of FIG. 9A. Despite this drawback, the method of reconstructing the field pattern according to the present invention provides sufficient accuracy for us to determine the field maximum and allows us to make a direct comparison with the measurement.

Figure 11:
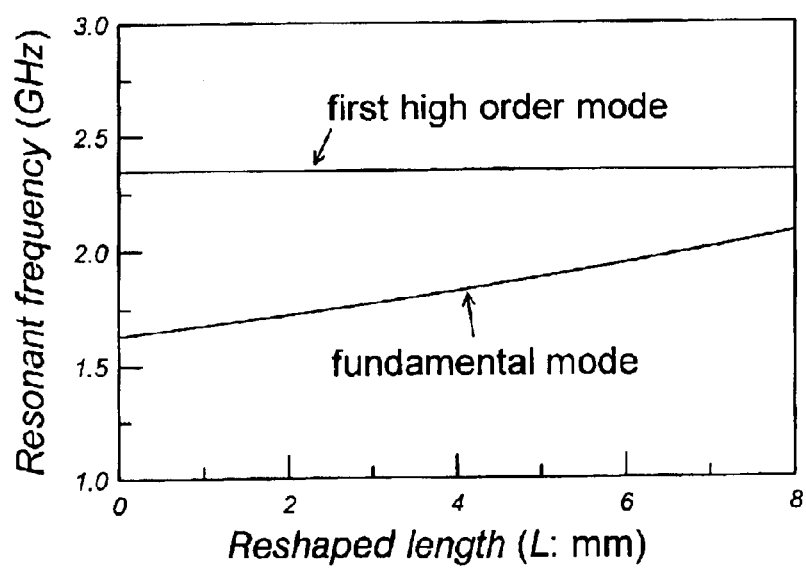
FIG. 11 is a graph showing a variation of resonant frequencies versus a reshaped length L of the Y-shaped microstrip resonator of FIG. 8.

Since the fundamental mode of the Y-shaped microstrip resonator has the field maximum region at the end of the central stem, as shown in FIGS. 9A and 10, reshaping the end of the central stem causes significant modification on the resonant frequency. FIG. 11 is a graph showing a variation of resonant frequencies versus a reshaped length L of the Y-shaped microstrip resonator of FIG. 8. The resonant frequency of the fundamental mode is raised from 1.632 GHz to 1.826 GHz when the reshaped length L is 4 mm. On the contrary, the field pattern of the first high order mode shown in FIG. 9B suggests the resonant frequency thereof will be independent of the reshaped length L, which has been further verified in FIG. 11.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What I claim is:

1. A method of detuning resonant frequencies of a power/ground plane in a power distribution system, comprising:

determining at least one region of the power/ground plane based on a distribution of an intensity of an electric field of a resonant mode such that a relatively high intensity among the distribution of the electric field is located on the at least one region, and reshaping the at least one region.

2. A method according to claim 1, further comprising:

determining the distribution of the intensity of the electric field of the resonant mode before determining the at least one region of the power/ground plane.

3. A method according to claim 2, wherein the distribution of the intensity of the electric field of the resonant mode is determined by means of analytical solutions of mathematical equations according to an electromagnetic theory or numerical simulations using commercial available software.

4. A method according to claim 2, wherein the distribution of the intensity of the electric field of the resonant mode is determined by the following step:

a) measuring a reflection coefficient $S_{11}$ in a frequency domain for a position of the power/ground plane;

b) calculated an intensity of the electric field $f$ according to an equation:

$$f \propto \sqrt{1-S_{11}^2}; \text{ and}$$

c) repeating the steps a) and b) throughout the power/ground plane to construct the distribution of the intensity of the electric field.

5. A method according to claim 1, wherein the at least one region is reshaped by reducing the size of the at least one region.

6. A method according to claim 1, wherein the frequency of the resonant mode is detuned to a relatively high frequency.

7. A method according to claim 1, wherein the resonant mode is a fundamental mode.

8. A method according to claim 1, wherein a portion of the power/ground plane is of a circular microstrip.

9. A method according to claim 1, wherein a portion of the power/ground plane is of a rectangular microstrip.

10. A method according to claim 1, wherein a portion of the power/ground plane is of a Y-shaped microstrip.

11. A method according to claim 1, wherein a portion of the power/ground plane is of a Y-shaped microstrip having a center stem and two wings connected to one end of the center stem.

12. A method according to claim 11, wherein the step of reshaping the at least one region is carried out by shortening a length of the center stem from another end of the center stem of the Y-shaped microstrip.

* * * * *